(12) United States Patent
Yamauchi et al.

(10) Patent No.: US 9,218,888 B2
(45) Date of Patent: Dec. 22, 2015

(54) NON-VOLATILE SEMICONDUCTOR MEMORY DATA READING METHOD THEREOF

(71) Applicant: Winbond Electronics Corp., Taichung (TW)

(72) Inventors: Kazuki Yamauchi, Saitama (JP); Katsutoshi Suito, Tokyo (JP); Oron Michael, San Jose, CA (US); Jongjun Kim, Cupertino, CA (US); Youn-Cherl Shin, Cupertino, CA (US)

(73) Assignee: Winbond Electronics Corp., Taichung (TW)

( * ) Notice: Subject to any disclaimer, the term of this patent is extended or adjusted under 35 U.S.C. 154(b) by 151 days.

(21) Appl. No.: 14/039,341

(22) Filed: Sep. 27, 2013

(65) Prior Publication Data

US 2014/0104947 A1   Apr. 17, 2014

(30) Foreign Application Priority Data

Oct. 11, 2012   (JP) .................. 2012-226159

(51) Int. Cl.
*G11C 16/10* (2006.01)
*G11C 16/26* (2006.01)
(Continued)

(52) U.S. Cl.
CPC ............ *G11C 16/26* (2013.01); *G11C 16/0483* (2013.01); *G11C 7/06* (2013.01); *G11C 16/10* (2013.01)

(58) Field of Classification Search
CPC .... G11C 16/26; G11C 16/0483; G11C 16/00; G11C 16/06; G11C 16/10; G11C 7/06

USPC ....................... 365/185.09, 185.18
See application file for complete search history.

(56) References Cited

U.S. PATENT DOCUMENTS 7,023,741 B2 *  4/2006  Nakamura et al. ....... 365/189.04
7,453,739 B2 * 11/2008  Nakamura et al. ....... 365/189.05
(Continued)

FOREIGN PATENT DOCUMENTS

JP   H06-5085   A1   1/1994
JP   H08-45285  A1   2/1996
(Continued)

OTHER PUBLICATIONS

Machine Translated JP2001-202792 (disclosed in IDS dated on Mar. 21, 2014).*
(Continued)

*Primary Examiner* — Han Yang
*Assistant Examiner* — Xiaochun L Chen
(74) *Attorney, Agent, or Firm* — Muncy, Geissler, Olds & Lowe, P.C.

(57) ABSTRACT

A non-volatile semiconductor memory includes a memory array, a selecting device selecting a page according to addresses, a data storage device, storing page data, and an output device outputting the stored data. The data storage device includes a first data storage device receiving data from a selected page of the memory array, a second data storage device receiving data from the first data storage device, and a data transmission device configured between the first and the second data storage device. The data transmission device transmits data in a second part of the first data storage device to the second data storage device when data in a first part of the second data storage device is output, and transmits data in a first part of the first data storage device to the second data storage device when data in a second part of the second data storage device is output.

10 Claims, 16 Drawing Sheets

(51) Int. Cl.
*G11C 16/04* (2006.01)
*G11C 7/06* (2006.01)

(56) References Cited

U.S. PATENT DOCUMENTS

| | | | |
|---|---|---|---|
| 7,908,425 B2* | 3/2011 | Lee et al. | 711/103 |
| 8,081,522 B2* | 12/2011 | Murakami | 365/189.05 |
| 8,667,368 B2* | 3/2014 | Gupta | G06F 11/1064 365/185.12 |
| 2003/0156455 A1* | 8/2003 | Nakamura et al. | 365/185.17 |
| 2007/0201279 A1 | 8/2007 | Nakamura et al. | |
| 2009/0019215 A1* | 1/2009 | Lee et al. | 711/103 |
| 2010/0172181 A1* | 7/2010 | Murakami | 365/185.12 |
| 2013/0297987 A1* | 11/2013 | Gupta | G06F 11/1064 714/773 |

FOREIGN PATENT DOCUMENTS

| | | |
|---|---|---|
| JP | 2001184874 A1 | 7/2001 |
| JP | 2001202792 A1 | 7/2001 |
| JP | 2003249082 A1 | 9/2003 |
| JP | 2012228058 A1 | 11/2012 |
| KR | 10-2003-0051402 A | 6/2003 |

OTHER PUBLICATIONS

Office Action issued on Dec. 22, 2014 in corresponding KR Patent Application No. 10-2013-0099077 and an Engligh language translation thereof.

* cited by examiner

| L2 | Wait |
|---|---|
| TG | |
| L1 | Page 0 |

⇧ Page 0

FIG. 7A

| L2 | P0-C0 | Wait/P0-C1 |
|---|---|---|
| TG | ⇧ | ⇧ |
| L1 | Page 0 | Page 0 |

FIG. 7B

Data output →

| L2 | P0-C0 | P0-C1 |
|---|---|---|
| TG | | ⇧ |
| L1 | Page 0 | Page 0 |

⇧ Page 1

FIG. 7C

Data output →

| L2 | P1-C0 | P0-C1 |
|---|---|---|
| TG | ⇧ | |
| L1 | Page 1 | Page 1 |

FIG. 7D

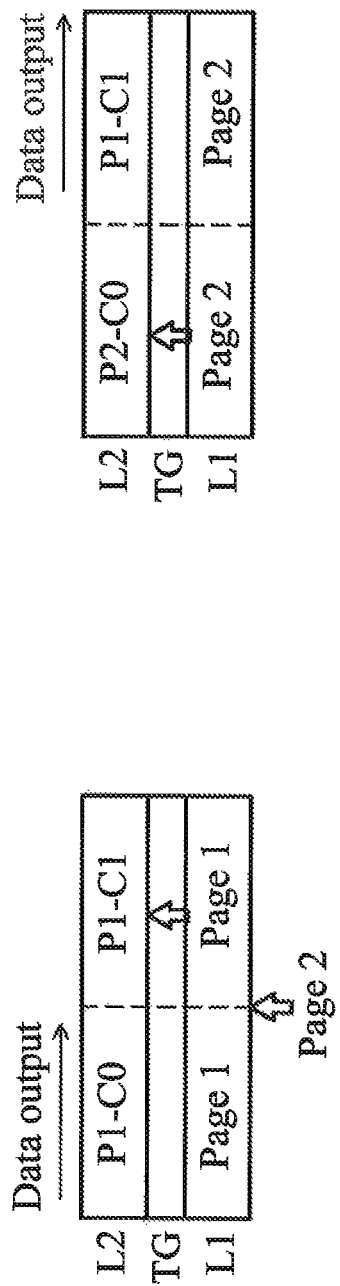
FIG. 7E
FIG. 7F
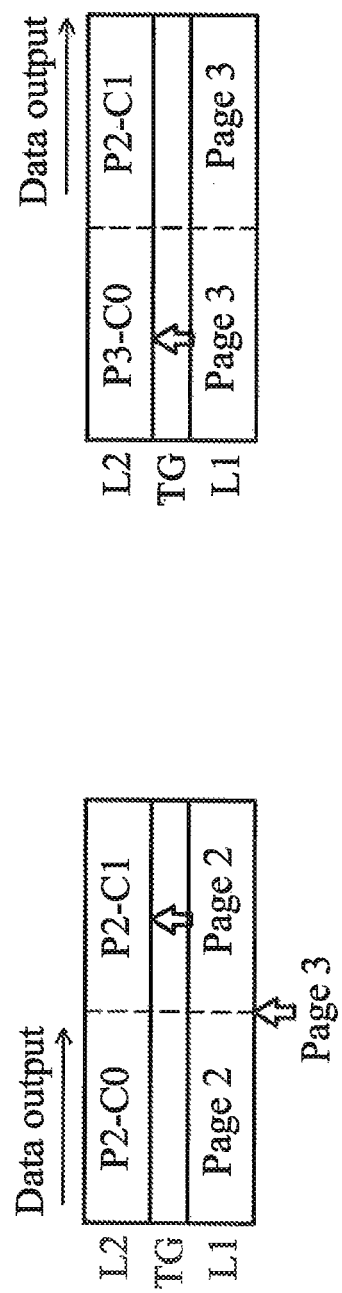
FIG. 7G
FIG. 7H

NON-VOLATILE SEMICONDUCTOR MEMORY DATA READING METHOD THEREOF

CROSS REFERENCE TO RELATED APPLICATIONS

This Application claims priority of Japan Patent Application No. 2012/226159, filed on Oct. 11, 2012, the entirety of which is incorporated by reference herein.

BACKGROUND OF THE INVENTION

1. Field of the Invention

The invention relates to a non-volatile semiconductor memory device, and more particularly to a reading method of a NAND-type flash memory.

2. Description of the Related Art

A conventional NAND-type flash memory comprises a memory array consisting of a plurality of NAND strings arranged in a matrix form. The NAND string comprises a plurality of memory cells connected in serial, a bit line select transistor connected to one end of the NAND string and a source line select transistor connected to the other end of the NAND string. FIG. 1 is a circuit diagram illustrating a structure of NAND strings. In the memory array, a plurality of NAND strings (referred to as cell units NU thereinafter), each of which comprises a plurality of memory cells connected in serial, is formed in a matrix form. In the example as shown in FIG. 1, a cell unit NU is composed of 32 memory cells MCi (i-0, 1, . . . , 31) connected in serial, a bit line select transistor BST connected to one end of the cell unit NU and a source line select transistor SST connected to the other end of the cell unit NU. The drain of the bit line select transistor BST is connected to a corresponding bit line GBL, and the source of the source line select transistor SST is connected to a common source line SL. The control gate of the memory cell MCi is connected to a word line WLi. The gate of the bit line select transistor BST and the gate of the source line select transistor SST are respectively connected to select gate lines SGD and SGS, which are extended in parallel with the word lines WLi.

Generally speaking, each memory cell includes source/drain of N-type diffusion region, a tunnel oxide film formed on a channel between the source and the drain, a floating gate (charge accumulation layer) formed on the tunnel oxide film, and a control gate formed on the floating gate through a dielectric layer. Conventionally, when no charge is accumulated in the floating gate, that is, when data "1" is written, the threshold is negative and the memory cell is normally on. When electrons are accumulated in the floating gate, that is, when data "0" is written, the threshold is shifted toward a positive value and the memory cell is normally off.

In a reading operation, a low-level voltage (L level, for example, 0 V) is supplied to the control gate of the selected memory cell and a high-level voltage (H level, for example, 4.5 V) is supplied to the control gates of those unselected memory cells, so as to turn on the bit line select transistor BST and the source line select transistor SST and detect the voltage level of the bit line GBL. In a programming writing-in) operation, a voltage of 0 V is supplied to the P-well of the substrate, the drain, the channel, and the source of the memory cell, a H level programming voltage Vpgm (for example, 20 V) is supplied to the control gate of the selected memory cell, an intermediate-level voltage (for example, 10 V) is supplied to the control gates of those unselected memory cells, so as to turn on the bit line select transistor BST and turn off the source line select transistor SST, and a voltage level corresponding to data "0" or "1" is supplied to the bit line GBL. In an erasing operation, a voltage of 0 V is supplied to the control gates of the selected memory cells in a memory block, a H level voltage (for example, 20 V) is supplied to the P-well, and electrons in the floating gates are pulled to the substrate, so as to erase data in unit of block.

In a NAND flash memory, a page buffer is used to read data from or write data into the memory array. When reading data, data in a selected page of the memory array is transmitted in parallel to the page buffer via the bit lines, and data stored in the page buffer is output in serial according to a clock signal. When writing data, data is input into the page buffer in serial according to a clock signal, and then the data is written from the page buffer into the selected pages of the memory array via the bit lines. In a NAND flash memory as disclosed in the patent document 1, address information is input and a page is selected according to the address information. When data in the selected page is transmitted from the memory array to the page buffer, the NAND flash memory outputs a busy signal indicating that external access is prohibited. After the data transmission is completed, the NAND flash memory outputs a ready signal indicating that external access is allowed.

RELATED PATENT DOCUMENTS

[Patent Document 1] JP 2002-93179

BRIEF SUMMARY OF THE INVENTION

Problems to be Solved

FIG. 2A is a time chart of a continuous page read operation of a conventional flash memory. Here, as shown in FIG. 2A(A), the continuous page read operation is started from a page address M and a column address N. In response to an external control signal CLE, a command "00h" for a reading mode is retrieved by a command register, and the command "00h" is decoded so as to start the reading mode. Then, in response to an address latch enable signal ALE and #WE, after a row address and a column address are retrieved by an address register in order, a command "30h" for page reading is input. In response to the command "30h", an L level busy signal indicating that access is prohibited during a period tR is output from an output pin RY/#BY. After the busy signal is output, a command "31h" for incrementing the page address used in the continuous page read operation is input. In response to the command "31h", a busy signal having a time length of tRCBSY is output. As shown in FIG. 2A(A), data in the selected page M is transmitted to a page buffer PB via bit lines, and, in response to an external control signal #RE, data stored in the page buffer PB is output in serial by incrementing the column address.

After the output of the data in the page M is completed, in response to the command "31h", the page address is incremented to be M+1, and the busy signal (tRCBSY) is output. FIG. 2A(C) illustrates a case where data in the page M+1 is transmitted to the page buffer PB. When the data transmission to the page buffer PB is completed, the ready signal is output, and data in the page buffer PB is output in serial.

When there is no more command "31h" to be input, the continuous page read operation ends. Alternatively, the continuous page read operation ends based on an input command "3Fh" indicating the last reading in the continuous page read operation. FIG. 2B illustrates an example where the command "3Fh" is input. After the address of the page M is input, the command "31h" for continuous page reading is input. When the output of the data in the page M is completed, the command "3Fh" is input to indicate that the page address is incremented for the last time, and then data in page M+1 is output. As shown in FIG. 3, the page buffer PB comprises two data registers L1 and L2 connected to each other and data input/output is performed by pipeline operation. As shown in FIG. 3A, the page M is selected according to an address input from the outside, and data in the selected page M is transmitted to the data register L1. The period when data in the selected page M is transmitted to the data register L1 corresponds to the period tR. Then, data stored in the data register L1 is transmitted to the data register L2 in parallel. When the data transmission to the data register L2 is completed, the next page M+1 is selected according to the page address incremented based on the command "31h", and data in the selected page M+1 is transmitted to the data register L1. The period when the page M+1 is selected and data in the page M+1 is transmitted to the data register L1 corresponds to t period tRCBSY of the busy signal. During the period when data in the page M+1 is transmitted to the data register L1, data in the page M is output from the data register L2.

As described above, since the known page buffer PB controls data in a whole page at a time, the period tRCBTY often occurs at a page boundary and/or a block boundary like a gap in the continuous page read operation. Therefore, a problem that data cannot be read out continuously may occur. In addition, since the busy period tRCBSY is longer than the read cycle period tRC during which data is read out from the page buffer PB, when a continuous read operation for a huge amount of pages is performed, the required time for reading all the pages may increases.

In view of this, the purpose of the invention is to provide a non-volatile semiconductor memory for performing high-speed data reading and solving the problems of the related art described above.

Means for Solving the Problems

An embodiment of the invention provides a non-volatile semiconductor memory device, comprising: a memory array, comprising a plurality of memory cells; a selecting device, selecting a page of the memory array according to address information; a data storage device, storing data in the page selected by the Selecting device; and an output device, outputting data stored in the data storage device, wherein the data storage device comprises: a first data storage device, receiving data from the page of the memory array; a second data storage device, receiving data transmitted by the first data storage device; and a data transmission device, configured between the first data storage device and the second data storage device, wherein during a period when the output device outputs data in a first part of the second data storage device, the data transmission device transmits data in a second part of the first data storage device to the second data storage device, and during a period when the output device outputs data in a second part of the second data storage device, the data transmission device transmits data in a first part of the first data storage device to the second data storage device. The non-volatile semiconductor memory device further comprises: an error correction device, performing error correction on data, wherein during a period when data in the first part of the second data storage device is output, the error correction device performs error correction on data in the second part of the second data storage device, and during a period when data in the second part of the second data storage device is output, the error correction device performs error correction on data in the first part of the second data storage device. The data transmission device comprises: a plurality of transmission transistors, transmitting data stored in the first data storage device to the second data storage device, wherein selected ones of the plurality of transmission transistors are turned on in response to outputting data in the first part or the second part of the second data storage device by the output device. The output device further comprises a column address counter, when a counting value of the column address counter reaches a column address of a boundary of the first part or the second part, the selected ones of the plurality of transmission transistors are turned on. The first data storage device comprises a plurality of first latch circuits, each of which corresponds to one of a plurality of bit lines, the second data storage device comprises a plurality of second latch circuits, each of which corresponds to one of the plurality of bit lines, and each of the plurality of first latch circuits of the first data storage device is connected to a corresponding one of the plurality of second latch circuits of the second data storage device through two transmission transistors. Storage capacity of the first data storage device and storage capacity of the second data storage device are equal to one page of the memory array, and the data transmission device transmits data stored in the first data storage device in a unit of 1/2 page. When performing continuous page reading, the output device serially outputs data stored in the second data storage device in a way that there is no discontinuousness at page boundaries.

Another embodiment of the invention provides a data reading method, applied to a non-volatile semiconductor memory device, wherein the non-volatile semiconductor memory device comprises: a memory array, comprising a plurality of memory cell's; a page buffer, storing data transmitted from a selected page of the memory array according to address information; and an output device, serially outputting data stored in the page buffer, wherein the page buffer comprises: a first data register, receiving data from the page of the memory array; a second data register, receiving data transmitted from the first data register; and a transmission gate, configured between the first data register and the second data register, wherein the data reading method comprises: during a period when outputting data in a first part of the second data register, transmitting data in a second part of the first data register to the second data register by the transmission gate; and during a period when outputting data in a second part of the second data register, transmitting data in a first part of the first data register to the second data register by the transmission gate. The data reading method further comprises: during a period when outputting data in the first part of the second data register, performing error correction on data in the second part of the second data register; and during a period when outputting data in the second part of the second data register, performing error correction on data in the first part of the second data register. The data reading method further comprises: starting continuous page reading according to input address information and a reading command; and continuously outputting data from the second data register in a way that there is no discontinuousness at page boundaries.

Effect of the invention

According to the invention, since data stored in the first data storage device is transmitted to the second data storage device in divisions, data can be transmitted to the first data storage device during the period when data stored in the second data storage device is output, and thus the speed for reading data can be increased.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 7A to 7H are block diagrams of a continuous page read operation according to an embodiment of the invention;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The embodiments of the invention are described below with references made to the accompanying drawings. Here, an example of a NAND-type flash memory is used as a preferred embodiment. In addition, to be noted, for simplicity and clarity, the elements in the Figures may be enlarged and have different proportions from that in the practical situation.

Figure 4:
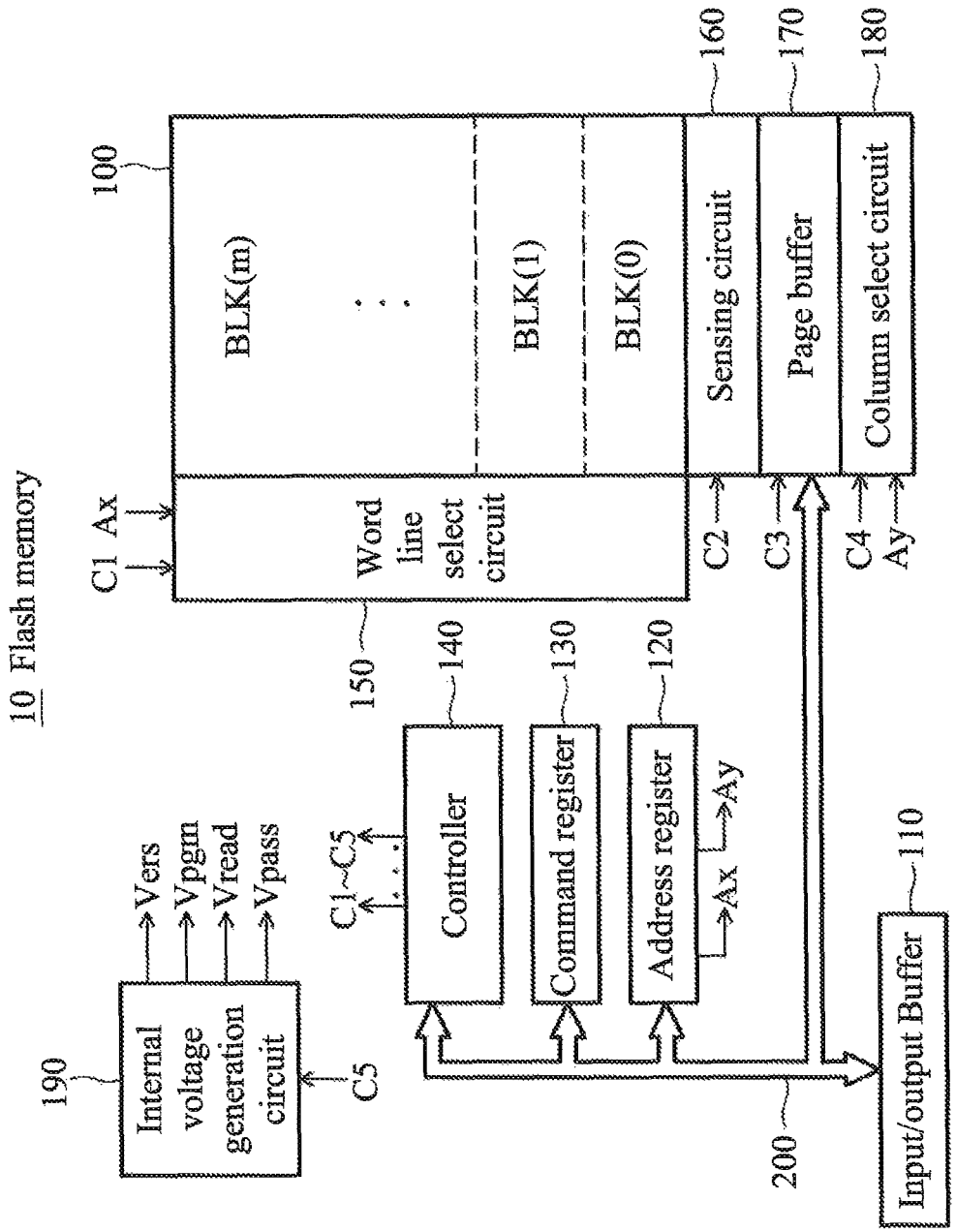
FIG. 4 is a block diagram of a structure of a flash memory according to an embodiment of the invention.

FIG. 4 is a block diagram of a brief structure of a NAND-type flash memory 10 according to an embodiment of the invention. The flash memory 10 comprises: a memory array 100, having a plurality of memory cells arranged in a matrix form; an input/output buffer 110, connected to an external input/output terminal I/O, storing input/output data; and address register 120, receiving address information from the input/output buffer 110; a command register 130, receiving command data from the input/output buffer 110; a controller 140, decoding the command data received from the command register 120 and outputting, based on the decoding result, control signals C1~C5 for controlling components; a word line select circuit 150, decoding a row address information Ax received from the address register 120 and selecting memory blocks and word lines based on the decoding result; a sensing circuit 160, connected to bit lines of the memory array 100, reading out data in a selected page; a page buffer 170, storing data read-out by the sensing circuit 160 and storing page data to be written; a column select circuit 180, decoding a column address Ay received from the address register 120 and selecting columns based on the decoding result; an internal voltage generation circuit 190, generating voltages required for reading, programming and erasing data, such as a programming voltage Vpgm, a pulse voltage Vpass, a read-out pulse voltage Vread and an erasing voltage Vers; and a data bus 200, connected to the components.

Figure 1:
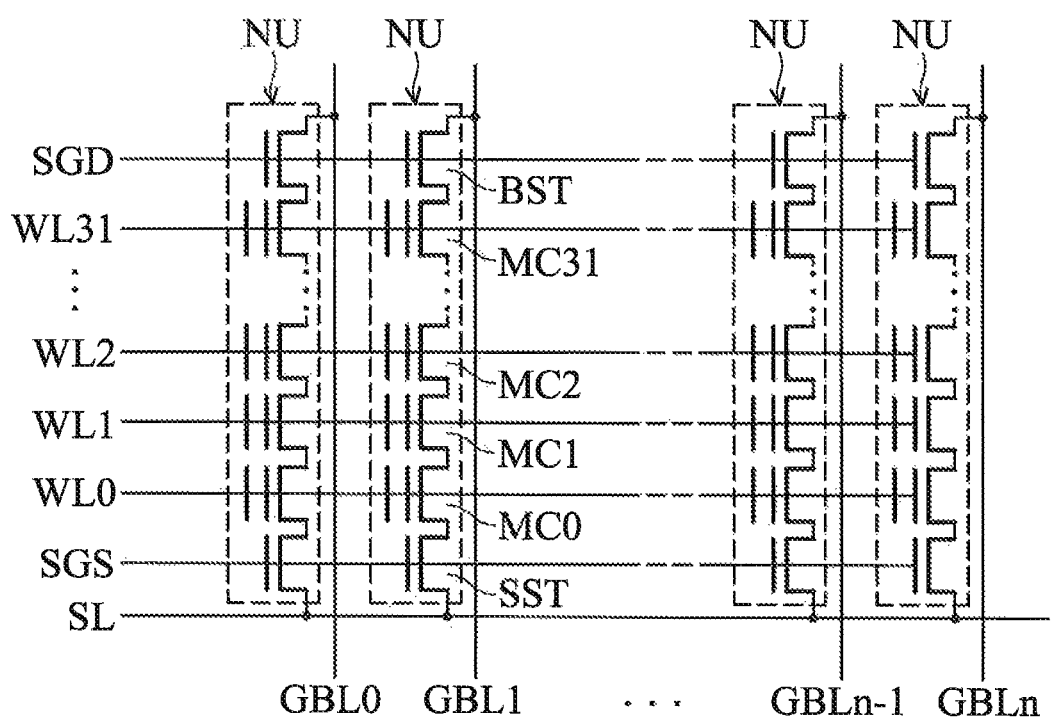
FIG. 1 is a block diagram of an example of a circuit structure of a memory array in a flash memory.

The memory array 100 comprises memory blocks BLK(0), BLK(1), BLK(2), . . . , BLK(m) arranged along the column direction. Each memory block is composed of a plurality of cell units NU as shown in FIG. 1, and each cell unit NU is composed of a plurality of memory cells connected in serial.

Bit lines GBL0, GBL1, . . . , GBLn connected to the cell units NU are connected to the sensing circuit 160 and the page buffer 170 through a bit line select circuit. When reading or programming data, the bit line select circuit selects even-numbered bit lines or odd-numbered bit lines and connects the selected even-numbered bit lines or odd-numbered bit lines to the page buffer 160 and the page buffer 170.

Figure 5:
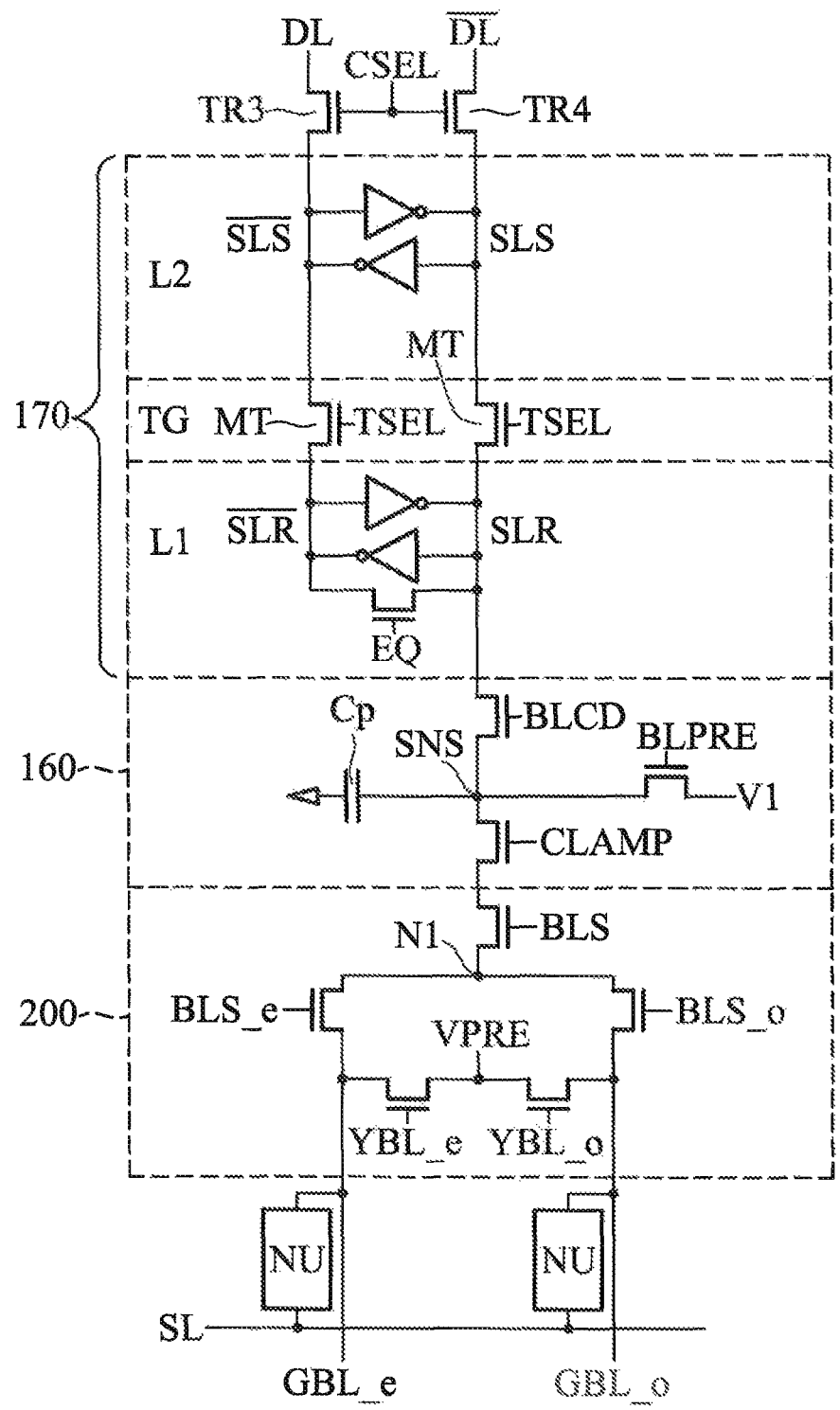
FIG. 5 is a circuit diagram of a page buffer, a sensing circuit and a bit line select circuit according to an embodiment of the invention.

FIG. 5 is a circuit diagram of a bit e select circuit, a sensing circuit and a page buffer according to an embodiment of the invention. Here, an example where an even-numbered bit line GBL_e and an odd-numbered bit line GBL_o are a pair of bit lines is illustrated. The sensing circuit 160 and the page buffer 170 are shared by the pair of the even-numbered bit line GBL_e and the odd-numbered bit line GBL_o. In this case, the amount of even-numbered bit lines connected to one word line is equal to the bit amount of one page. If the amount of odd-numbered bit lines connected to one word line is also equal to the bit amount of one page (that is, two pages in total), bit amounts of the sensing circuit 160 and the page buffer 170 are both equal to the bit amount of one page.

The bit line select circuit 200 comprises: an even-number select transistor BLS_e, selecting the even-numbered bit line GBL_e; an odd-number select transistor BLS_o, selecting the odd-numbered bit line GBL_o; and a bit line select transistor BLS, connected to and between the sensing circuit 160 and a common node N1 of the even-number select transistor BLS_e and the odd-number select transistor BLS_o). The transistors BLS_e, BLS_o and BLS are N-type MOS transistors.

Control signals from the controller 140 are supplied to the gates of the even-number select transistor BLS_e, the odd-number select transistor BLS_o and the bit line select transistor BLS to make the transistors selectively turn on or off when reading, programming and erasing data. For example, in a reading operation, the even-numbered bit line GBL_e is selected while the odd-numbered bit line GBL_o is not selected. Thus, the even-number select transistor BLS_e and the bit line select transistor BLS are turned on white the odd-number select transistor BLS_o is turned off. In addition, in a reading operation, the odd-numbered bit line GBL_o is selected while the even-numbered bit line GBL_e is not selected, and thus, the odd-number select transistor BLS_o and the bit line select transistor BLS are turned on While the even-number select transistor BLS_e is turned off.

The bit line select circuit 200 further comprises: an even-number bias select transistor YBL_e connected to and between the even-numbered bit line GBL_e and a virtual voltage VPRE; and an odd-number bias select transistor YBL_o connected to and between the odd-numbered bit line GBL_o and the virtual voltage VPRE. The even-number bias select transistor YBL_e and the odd-number bias select transistor YBL_o are both composed of an N-type MOS transistor.

Control signals from the controller 140 are supplied to the gates of the even-number bias select transistor YBL_e and the odd-number bias select transistor YBL_o to make the transistors selectively turn on or off when reading, programming and erasing data. Moreover, the virtual voltage VPRE may provide a bias voltage corresponding to the operation status of the internal voltage generation circuit 180 based on the control of the controller 140. For example, in a page read operation, when the even-numbered bit line GBL_e is selected and the odd-numbered bit line GBL_o is not selected, the even-number bias select transistor YBL_e is turned off, the odd-number bias select transistor YBL_o is turned on, and a shield voltage (GND) is provided on the odd-numbered bit line GBL_o through the virtual voltage VPRE. In addition, when the even-numbered bit line GBL_e is not selected and the odd-numbered bit line GBL_o is selected, the even-number bias select transistor YBL_e is turned on, the odd-number bias select transistor YBL_o is turned off, and the shield voltage (GND) is provided on the even-numbered bit line GBL_e through the virtual voltage VPRE. When programming data, a programming prohibition voltage is supplied to the virtual voltage VPRE, and therefore, channels of memory cells corresponding to an unselected bit line are biased or pre-charged to the programming prohibition voltage.

The sensing circuit 160 comprises: a clamp transistor CLAMP, connected in serial to a bit line which is common to the even-numbered bit line and the odd-numbered bit line; a pre-charge transistor BLPRE, connected to a sensing node SNS; a capacitor Cp, connected to the sensing node SNS; and a transmission transistor BLCD, connected to and between the sensing node SNS and the page buffer 170. The transistors in the sensing circuit 160 are N-type MOS transistors, and the transistors are selectively turned on or off based on control signals from the controller 140. When reading data, the pre-charge transistor BLPRE is turned on, a pre-charge voltage provided by a voltage source V1 is used to pre-charge the selected even-numbered or odd-numbered bit line through the clamp transistor CLAMP. The read-out H level or L level voltage is stored on the sensing node SNS and then transmitted to the page buffer 170 through the turned-on transmission transistor BLCD.

The page buffer 170 comprises: a first data register L1, storing data transmitted from the sensing circuit 160; a second data register L2, receiving data transmitted from the first data register L1; and a transmission gate. TG, transmitting data stored in the first data register L1 to the second data register L2.

The first data register L1 comprises: a latch circuit composed of a pair of inverters connected to each other; and an equalization transistor EQ connected to nodes SLR and $\overline{SLR}$ of the latch circuit. The second data register L2 comprises a latch circuit composed of a pair of inverters connected to each other. The transmission gate TG comprises transistors MT. The transistors MT are a pair of NMOS transistors, one of which is connected to and between the node SLR of the latch circuit in the first data register L1 and the node SLS of the latch circuit in the second data register L2, and the other of which is connected to and between the node $\overline{SLR}$ of the latch circuit n the first data register L1 and the node $\overline{SLS}$ of the latch circuit in the second data register L2. The transistors MT are controlled by a gate signal TSEL. As described in the following, every time when a counting value of a column address counter (column select circuit 180) reaches a value that is equal to 1/2 page of the second data register L2, the gate signal TSEL is changed to the high level and holds for a predetermined time period. Accordingly, the transmission transistors MT are turned on., and the voltage on the latch node SLR in the first data register L1 is transmitted to the latch node SLS in the second data register L2.

The page buffer 170, or the nodes SLS and $\overline{SLS}$ in the second data register L2 are connected to data lines DL and $\overline{DL}$ through transistor TR3 and TR4, respectively. The gates of the transistors TR3 and TR4 connected to a column select gate line CSEL from the column select circuit 180. When the transistors TR3 and TR4 are turned on, the second data register L2 retrieves programming data from the data lines DL and $\overline{DL}$, or the second data register L2 outputs the stored data to the data lines DL and $\overline{DL}$.

Figure 6A:
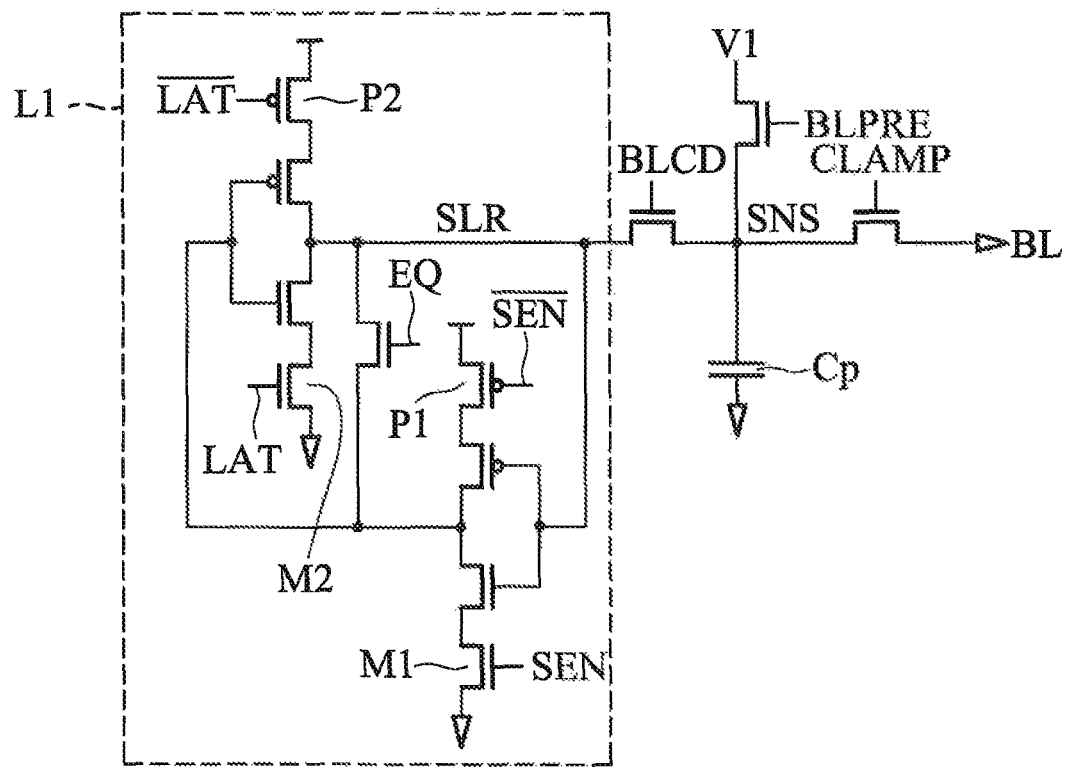
FIG. 6A is a circuit diagram of a sensing circuit and a first data register of a page buffer according to an embodiment of the invention.
Figure 6B:
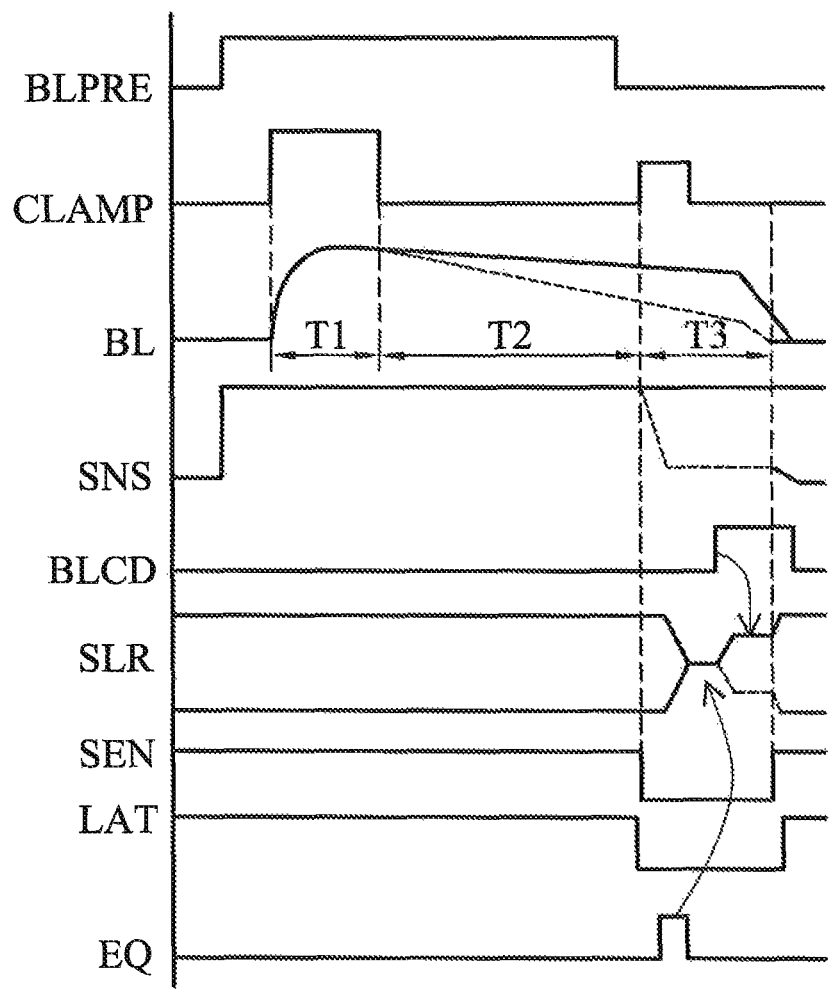
FIG. 6B is a time chart of signals in FIG. 6A.

FIG. 6A is a circuit diagram of the sensing circuit and the first data register L1 of the page buffer according to an embodiment of the invention. FIG. 6B is a time chart of signals in FIG. 6A. When reading data, the pre-charge transistor BLPRE is turned on, the sensing node SNS is pre-charged by the voltage provided by the voltage source V1. Then, the clamp transistor is turned on during a time period T1, and thus the bit line is pre-charged to a predetermine voltage. If the clamp transistor is turned off, a selected word line and an unselected word line are driven to 0V and 4.5V, respectively, and a current corresponding to data stored in the memory cell flows through the bit line BE During a time period T2, as shown in FIG. 6B, in a case where the memory cell stores data "1", the bit line BL is discharged (as shown by the dotted line); in a case where the memory cell stores data "0", since the memory cell is not conductive, the voltage of the bit line BL is barely changed.

Then, since the clamp transistor clamp is turned on for a predetermined time period, the voltage on the bit line is loaded into the sensing node SNS. As shown in FIG. 6B, in a sensing period T3, the transmission transistor BLCD is turned on for a predetermined time period, and the voltage on the sensing node SNS is transmitted the latch node SLR in the first data register L1.

The first data register L1 is composed of two inverters connected to each other. Before the voltage on the sensing node SNS is loaded, a PMOS transistor P1 and an NMOS transistor M1 are turned on by gate signals $\overline{SEN}$ and SEN, respectively. Similarly, a PMOS transistor P2 and an NMOS transistor M2 are turned on by gate signals $\overline{LAT}$ and LAT, respectively. Accordingly, the first data register L1 stores data on the latch node SLR. After that, if the clamp transistor CLAMP is turned on, the transistors P1, P2, M1 and M2 are turned off in response to turning-on of the clamp transistor CLAMP. Next, the latch nodes SLR and $\overline{SLR}$ are initialized by turning on the equalization transistor EQ for a predetermined time period. Then, a voltage corresponding to H level of L level of the voltage on the sensing node SNS is newly formed the latch node SLR.

A continuous page read operation according to an embodiment of the invention will be described in the following with reference to FIG. 7 and FIG. 8. The continuous page read operation is an operation where data is continuously read out from a head page address to a last page address. Conventionally, the command "00h" for the reading ode, a row address and a column address are input first. Next, when the command "30h" for page reading is input, a reading operation of the current processed page is completed within the busy period tR. Then, in order to read data continuously, the page address is automatically incremented based on the next command "31h" so as to perform a reading operation of the next page. If the command "31h" is not input, when the command "3Fh" indicating a reading operation of the last page is input, the continuous page read operation ends after the last page in the memory block is read.

The column select circuit 180 selects a position where data starts to be read in a page according to the input column address. Alternatively, data can automatically start to be read from a head position in the page without using the column address. In addition, the column select circuit 180 further comprises a column address counter for incrementing the column address in response to an external control signal RE or other reading clock signals. The column select circuit 180 activates a column select gate line corresponding to the counting value of the column address counter to H level so as to output data stored in the second data register L2 in serial. When the counting value of the column address counter reaches a value that is equal to the bit amount (column amount) of one page, the counting value of the column address counter is reset and the column address counter counts from 0 again. Moreover, the bandwidth of the serial data output is not limited to be 1 bit. For example, the bandwidth of the serial data output can be 8 or 16 bits.

In the embodiment, when a continuous page read operation is performed, data transmitted from the first data register L1 to the second data register L2 is not in unit of one page but in unit of 1/2 page. In view of this kind of transmission control, it is possible that data is output continuously without any busy period or blank period except for the initial busy period. Nevertheless, referring to the initial busy period, since the data registers L1 and L2 are empty at first, a page on data in the first data register L1 may be transmitted to the second data register L2 in unit of one page.

As shown in FIG. 7A, a page 0 is selected to be a head page in the memory array or the memory block. Data in the page 0 is transmitted to the first data register L1. Here, the gate signal TSEL of the transmission transistors MT of the transmission gate TG in FIG. 5 is at the low level, and thus the second data register L2 is electrically isolated from the first data register L1.

Next, as shown in FIG. 7B, 1/2 page of data is transmitted from the first data register L1 to the second data register L2. That is, in a case where one page is composed of n bits, only the preceding n/2 bits of page data is transmitted. In addition, the left half part of one page is referred to as C0 and the right half part of one page is referred to as C1 thereinafter for convenience. In order to transmit the left half part of data in the page 0 to the second data register L2, a gate signal TSEL of transmission transistors MT of bit lines connected to C0 is driven to H level and holds for a predetermined time period. Moreover, as described above, in the initial page read (the reading operation of the head page), one page of data (that is, data of C0 and C1) may be simultaneously transmitted from the first data register L1 to the second data register. As shown by the dotted arrow in FIG. 7B, data P0-C0 and data P0-C1 (P0 indicates the page 0), one page of data in total, may be simultaneously transmitted from the first data register L1 to the second data register L2. In this case, one page amount of transmission transistors MT are simultaneously turned on.

Then, as shown in FIG. 7C, data P0-C0 in the second data register L2 is output in serial. In response to the clock signal, the column select circuit 180 as described above drives gate lines CSEL to H level in order according to the column address being incremented, so as to serially output data P0-C0 in order. In the meantime, the right half part of data in the first data register L1, that is, data P0-C1, is transmitted to the second data register L2. At this time, a gate signal TSEL is driven to H level for a predetermined time period so as o turn on transmission resistors MT of bit lines connected to C1. Then, after the transmission of data P0-C1, data in a page 1 is transmitted to the first data register L1.

Next, as shown in FIG. 7D, data P0-C1 in the second data register L2 is output in serial. During the period when the data P0-C1 is output, data P1-C0 in the first data register L1 is transmitted to the second data register L2 through the transmission transistors MT. Then, as shown in FIG. 7E, during the period when data P1-C0 in the second data register L2 is output, data P1-C1 in the first data register L1 is transmitted to the second data register L2. After that, data in a page 2 is transmitted to the first data register L1. The continuous page read operation is performed in the same data reading pattern as described above hereinafter.

Figure 8A:
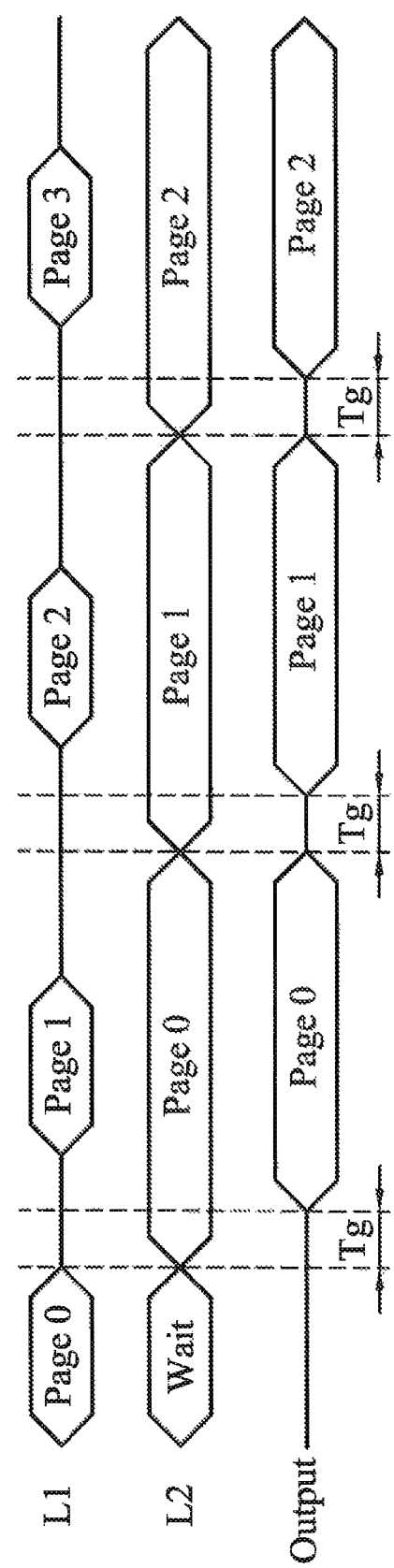
FIG. 8A is a time chart of data output in a case where a conventional page buffer performs a transmission control.
Figure 8B:
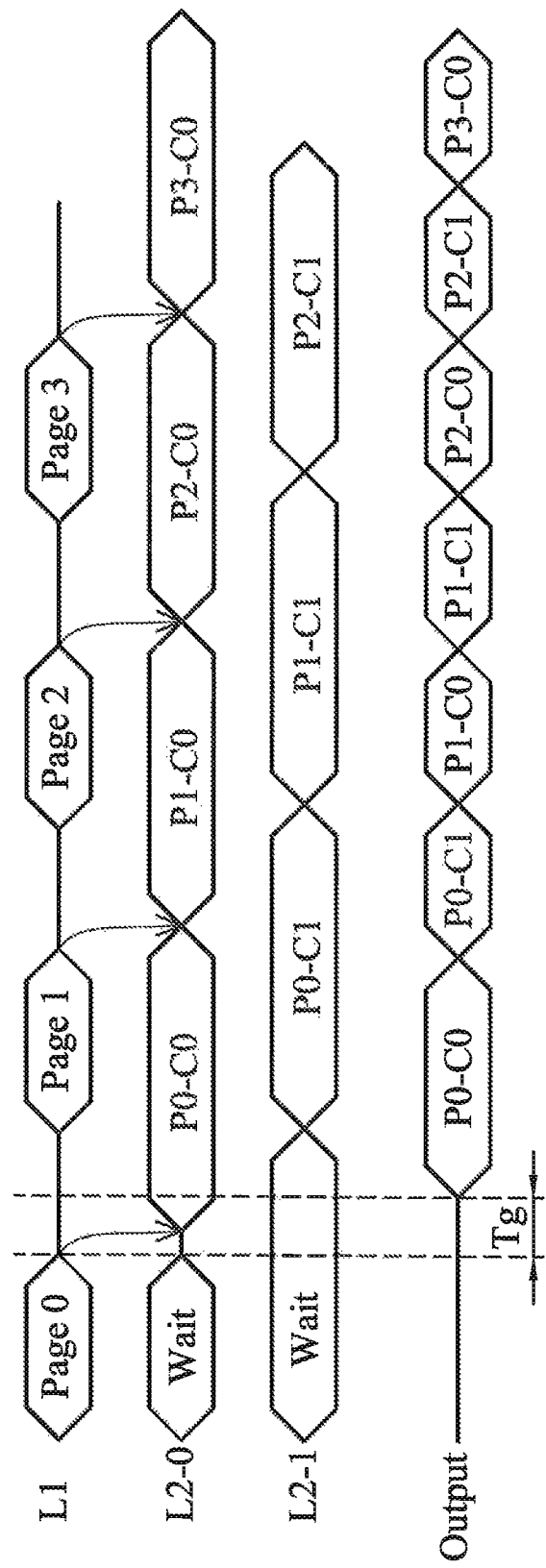
FIG. 8B is a time chart of data output in a case where a page buffer according to an embodiment of the invention performs a transmission control.

FIG. 8B is a time chart of the continuous page read operation in FIG. 7. As shown in FIG. 8B, though there is a gap or blank period in a time period Tg when data is transmitted from the first data register L1 to the second data register L2, there is no gap or discontinuous time period at page boundaries in the following data output. Therefore, data is continuously output, and high-speed data reading can be realized. On the other hand, FIG. 8A is a time chart of a page reading according to the related art. As shown in FIG. 8A, after data is output from the second data register L2, there are gaps Tg at page boundaries in order to transmit data from the first data register L1 to the second data register L2.

As described above, in the embodiment, since data transmission from the first data register L1 to the second data register L2 can be controlled to be performed separately in unit of 1/2 page, outputting data from the second data register L2 and transmitting data from the first data register to the second data register can be performed simultaneously, and there is no discontinuous time period at page boundaries or block boundaries so that data can be output continuously. In a case where it is assumed that there is no transmission transistor MT, data transmission from the first data register L1 to the second data register L2 and reading-out data from the core of the memory array use the same bus, and thus busy periods are required when crossing pages. In a case where there are transmission transistors MT as shown in the embodiment, data transmission from the first data register L1 to the second data register L2, since data transmission from the first data register L1 to the second data register L2 and reading-out data from the core of the v array don't use the same bus, continuous reading can be performed without busy period.

In addition, in the structure of the page buffer, only transmission transistors MT of the transmission gate TG between the data registers L1 and L2 are added, and only one control signal, i.e., the gate signal TSEL, is added. Accordingly, the layout area of the transmission gate TG is still small. Furthermore, referring to the transmission gate TG, since there are two transmission transistors MT for transmitting data provided on one bit line, the PASS voltage is not needed, and the control can be performed under low noise. In a case where it is assumed that there is only one transmission transistor, the gate voltage used on the transmission transistor has to be VDD+Vth (Vth is a threshold used for the transmission transistor, for example, VDD+Vth is equal to approximately a level of 5V) so as to ensure that data (at VDD level) in the first data register L1 can be transmitted to the second data register L2. On the other hand, in a case where two transmission transistors MT are used, as shown in the embodiment, a voltage difference can be generated between the nodes SLS and $\overline{SLS}$ provided on two sides of the second data register L2, and thus data can be certainty transmitted by using a VDD-level control signal to control the transmission transistors instead of a (VDD-+-Vth)-level control signal. Accordingly, noise corresponding to Vth can be eliminated and the page buffer can prevent from being influenced by the noise.

Figure 9:
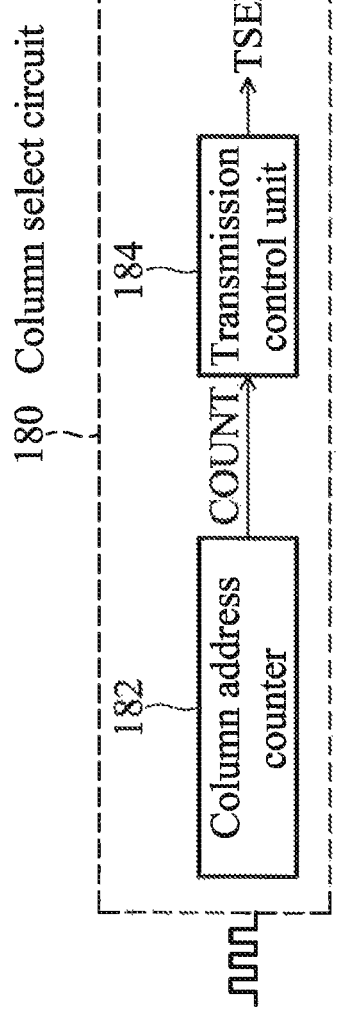
FIG. 9 is a block diagram of a structure of a column select circuit according to an embodiment of the inventoion.

FIG. 9 is block diagram of a structure of the column select circuit 180 in the embodiment. The column select circuit 180 drives column select gate lines CSEL and outputs data stored in the second data register L2 in order by being synchronized with rising edges and/or falling edges of a clock signal (for example, the signal RE) provided from an external device. Then, in order to control data transmission from the first data register L1 to the second data register L2, the column select circuit 180 further comprises a transmission control unit 184 utilizing the column address counter 182. The column address counter 182 counts a clock number of the clock signal and outputs a counting output COUNT to the transmission control unit 184. The transmission control unit 184 controls the gate signal TSEL of the transmission transistors MT based on the counting output COUNT.

Figure 10:
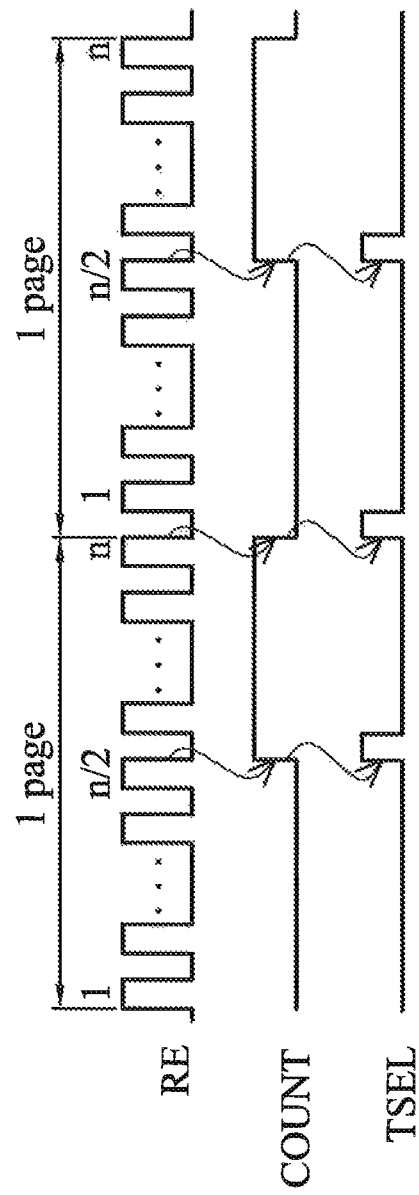
FIG. 10 is a time chart of the operation of the column select circuit in FIG. 9.

FIG. 10 is a time chart of the operation of the column address counter 182 and the transmission control unit 184. An example where data is transmitted from the first data register L1 to the second data register L2 synchronization with the output of the column address counter 182 after data in the head page is transmitted from the first data register L1 to the second data register L2 is illustrated in FIG. 10. In addition, if one page is composed of n bits, the first data register L1 and the second data register L2 both store n bits of data, and data in the second data register L2 is output from a head bit (column position) of the second data register L2 in synchronization with the clock signal. Data can be output in synchronization with rising edges, falling edges or both rising arid falling edges of the clock signal.

When the counting value of the column address counter 182 reaches n/2, the column address on counter 182 changes the counting output COUNT from low level to high level. When the counting value of the column address counter 182 reaches n, the column address counter 182 changes the counting output COUNT from high level to low level. That is, the column address counter 182 is equal to an n/2 frequency divider circuit. The transmission control unit 184 outputs a high-level gate signal TSEL holding for a predetermined time period in response to a Change (upward or downward) in the counting output COUNT. As shown in FIG. 7D, the gate signal TSEL is output in response to arriving at the last address in C0 or the head address in C1, so as to make data P1-C0 in the first data register L1 be transmitted to the second data register L2. Then, as shown in FIG. 7E, the gate signal TSEL is output in response to arriving at the last address in data P0-C1 or the head address in data P1-C0, so as to make data P1-C1 in the first data register L1 be transmitted to the second data register L2 and data in the next page (page 2) be transmitted to the empty first data register L1. In view of this, each time when 1/2 page of data is output from the second data register L2, 1/2 page of data is transmitted from the first data register L1 to the Second data register L2 alternately. In addition, when the first data register L1 is empty, data in the next page of the memory core is transmitted to the first data register L1.

Figure 2A:
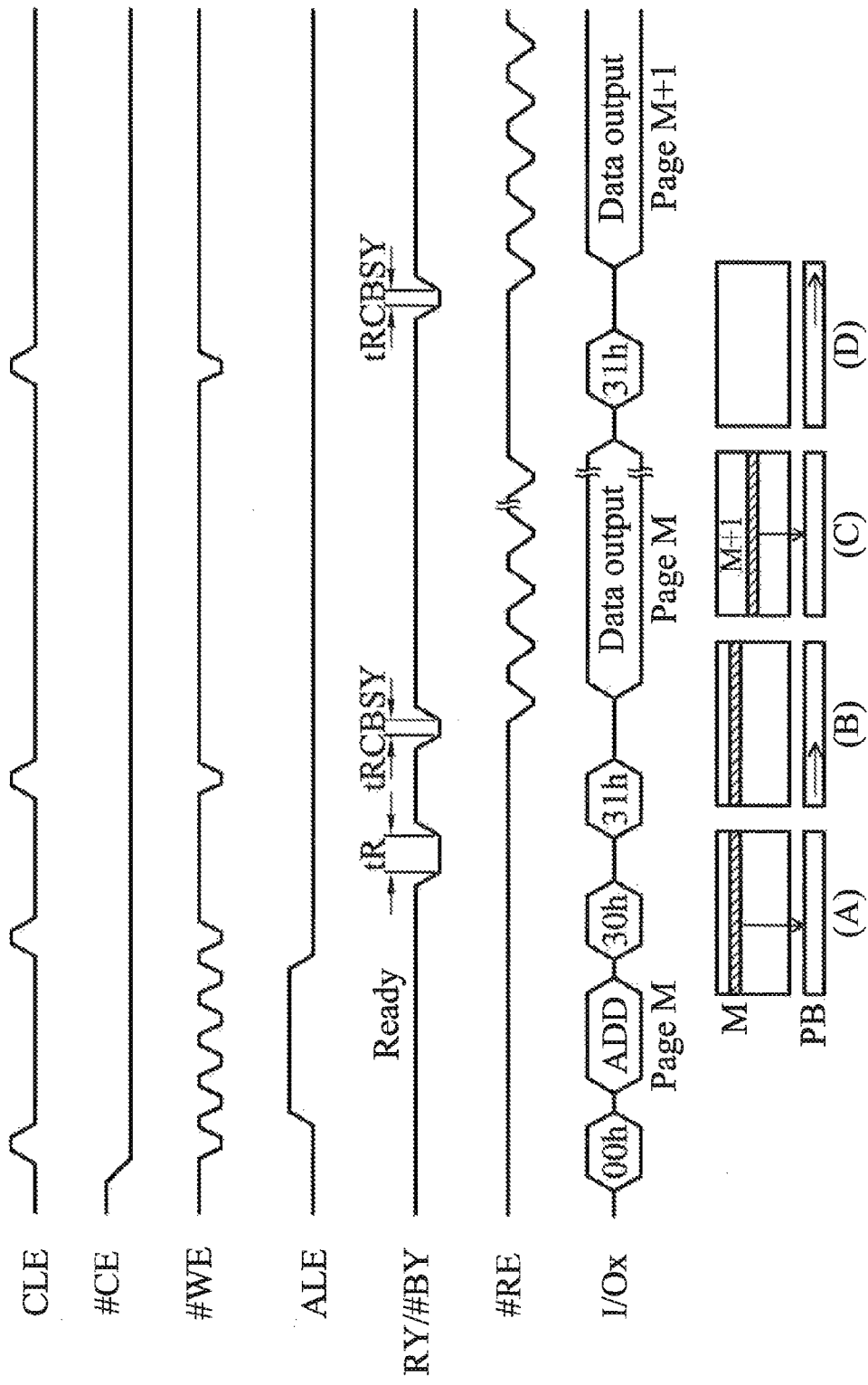
FIG. 2A is a time chart of a continuous page read operation of a conventional flash memory.
Figure 2B:
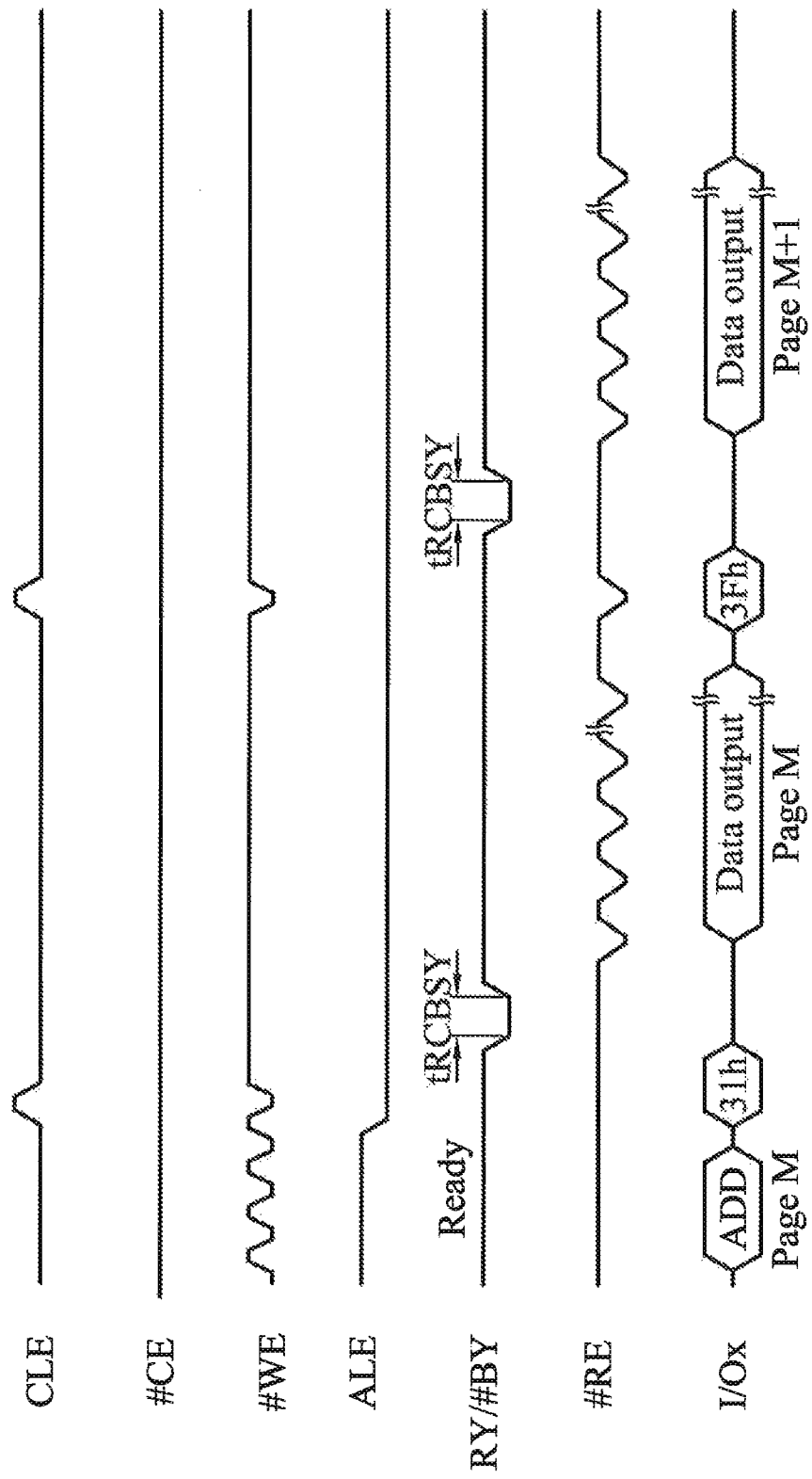
FIG. 2B is a time chart of a termination of a continuous page read operation of a conventional flash memory.
Figure 3B:
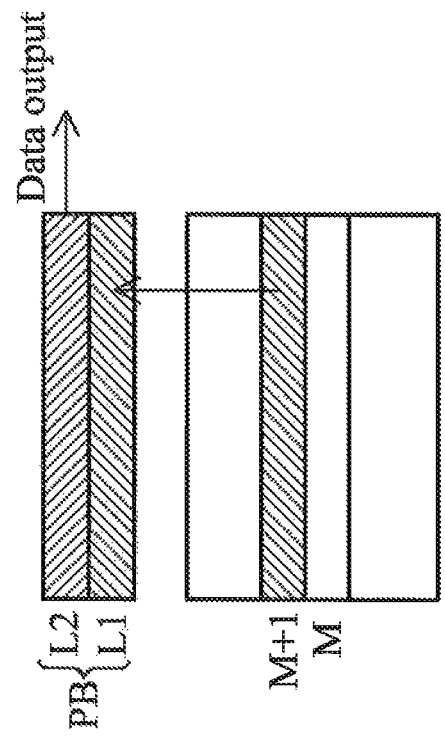
FIGS. 3A and 3B are block diagrams of conventional page buffers.
Figure 3A:
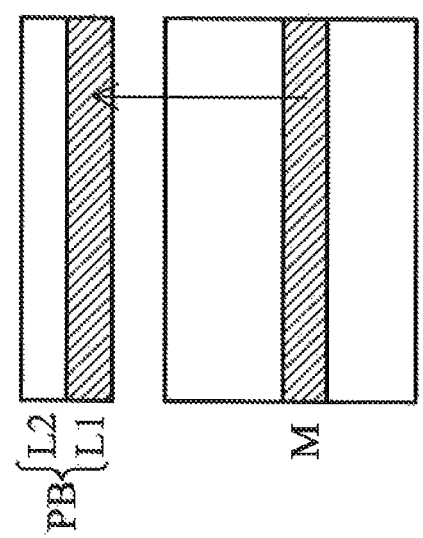
Figure 11:
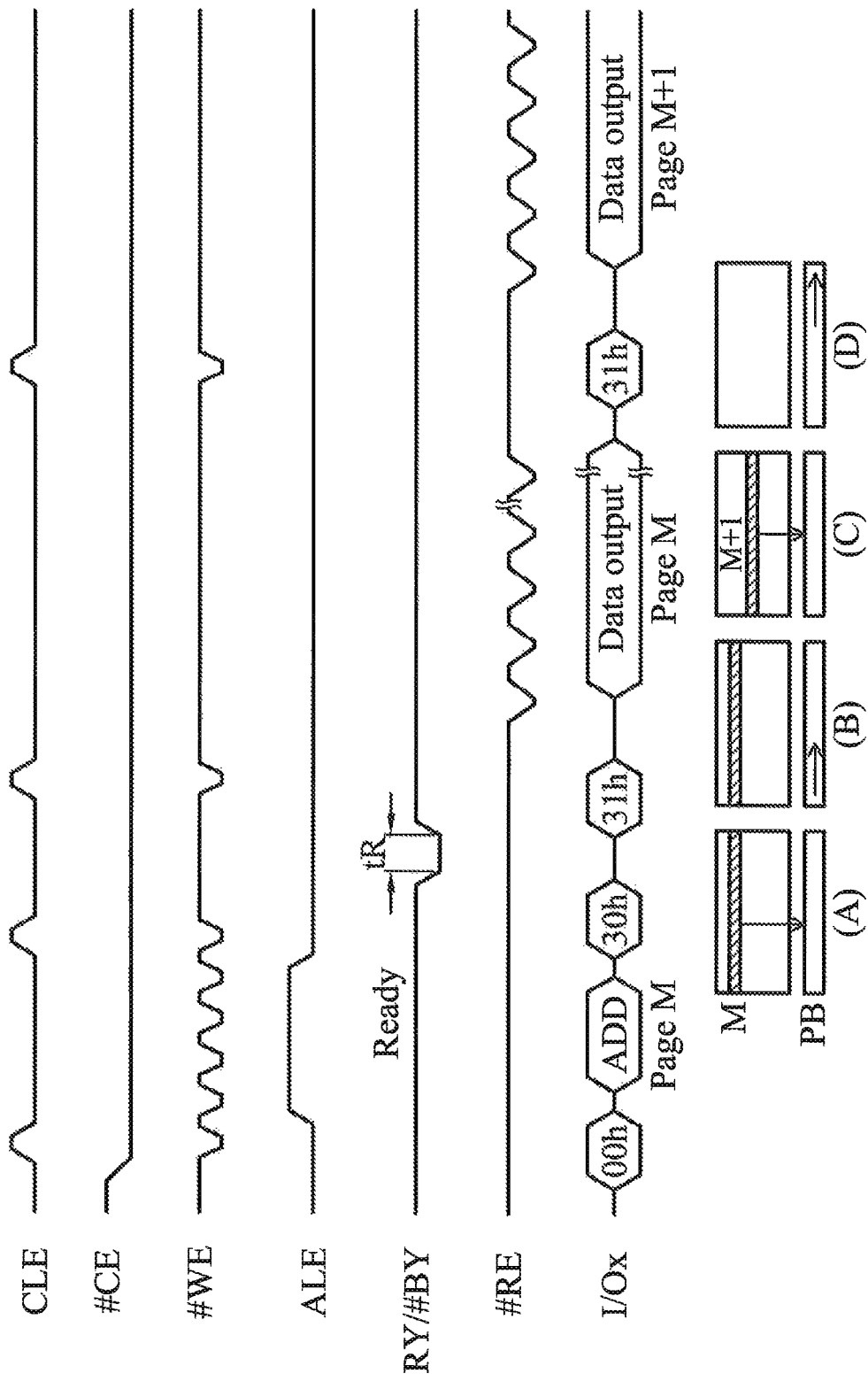
FIG. 11 is a time chart of a reading operation of a flash memory according to an embodiment of the invention.

FIG. 11 is a time chart of the continuous page read operation of the flash memory in the embodiment. In comparison with FIG. 2, there is no any other busy signal except for the busy signal (tR) of the initial data transmission on the output terminal RY/#BY in the embodiment.

Other embodiments will be described in the following. In the flash memory 100, an error correction function module for correcting errors in input/output data can further be embedded into the chip so as to perform an error correction operation on input/output data. For example, when reading data, data stored in the page buffer is transmitted to an error correction unit ECC first before output. An error detection operation and an error correction operation are performed on data in the error correction unit ECC and then the corrected data is transmitted back to the page buffer.

Figure 12:
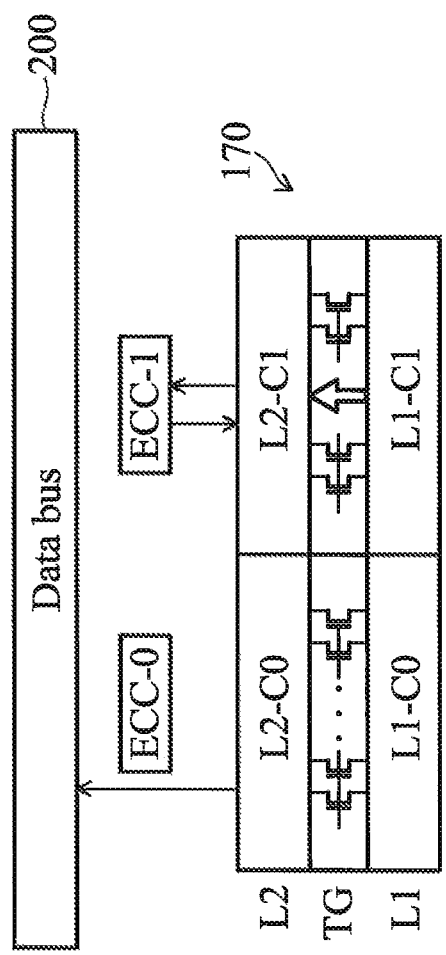
FIG. 12 is a block diagram of an error correction operation of a flash memory according to embodiment of the invention.

FIG. 12 is a block diagram of an error correction operation of according to an embodiment of the invention. The page buffer 170 is composed of the data register L1 and L2 and the transmission gate TG. The error correction of data in L2-C0 of the second data register L2 is completed and data in L2-C0 is serially output to the data bus 200. In the meantime, an error correction operation is performed on data in L2-C1 of the second data register L2, which was transmitted from L1-C1 of the first data register L1.

Figure 13A:
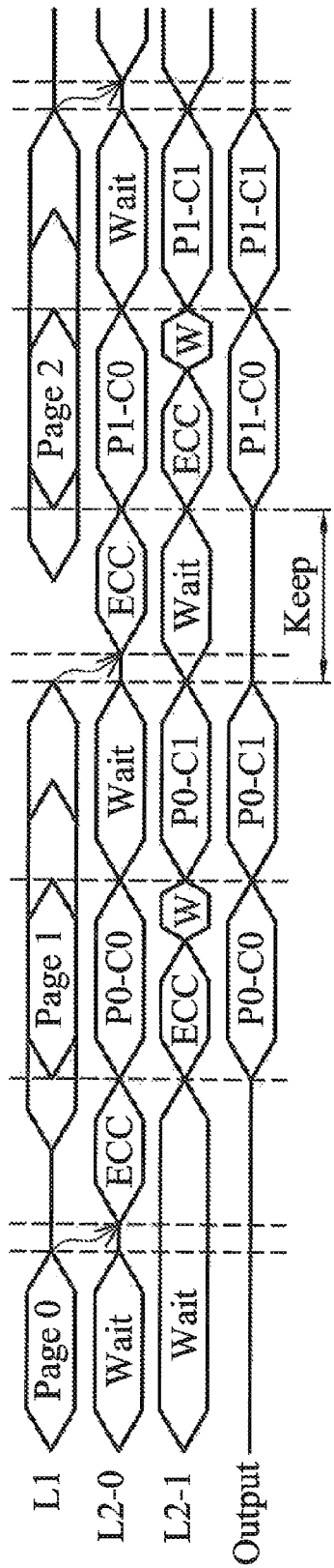
FIG. 13A is a time chart of an error correction opera n according to the related art.
Figure 13B:
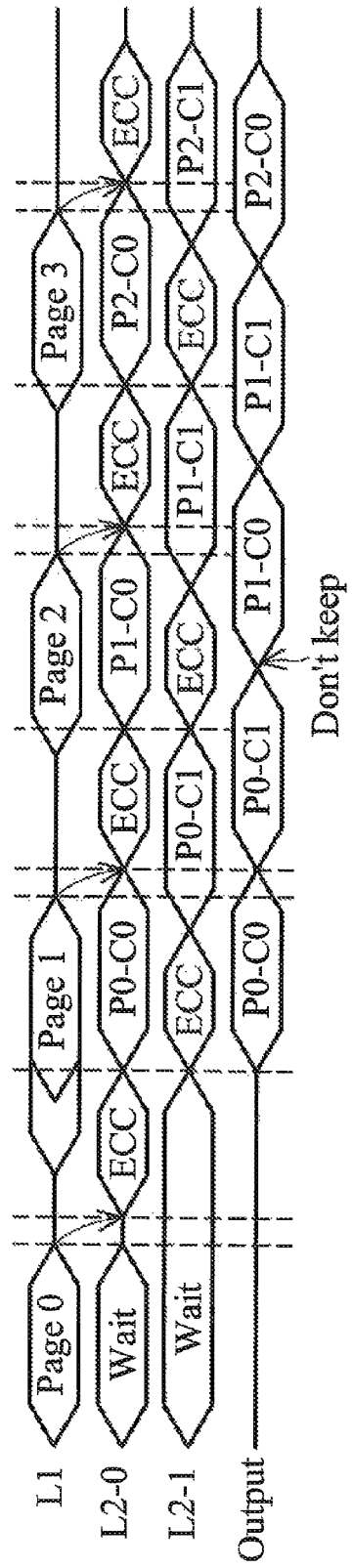
FIG. 13B is a time chart of an error correction operation according to an embodiment of the invention.

FIG. 13A is a time chart of a continuous page read operation during an error correction operation according to the related art. FIG. 13B is a time chart of the continuous page read operation during the error correction operation according to the embodiment of the invention. In the pave buffer in the related art, data transmission from the first data register L1 to the second data register L2 is performed in unit of one page. Accordingly, when the page 0 in the first data register L1 is transmitted to the second data register L2, the data in the next page, i.e., the page 1, is read out to the first data register L1. In the meantime, an error correction operation is performed on data P0-C0 in L2-C0 of the second data register L2 by ECC-0. After the error correction operation of data P0-C0 in L2-C0 is completed, an error correction operation is performed on data P0-C1 in L2-C1 of the second data register L2 by ECC-1. During the error correction operation of data P0-C1 in L2-C1, data P0-C0 is output. In the page buffer operation as described above, since data in the first data register L1 can't be transmitted to the second data register L2 until data P0-C1 in L2-C1 is completely output (that is, data in page 2 can'be transmitted to the data register at this time), there are discontinuous gaps occurring at page boundaries.

On the other hand, the reading operation in the embodiment is shown in FIG. 13B. During the period when data P0-C1 in the second data register L2 is output, data P1-C0 is transmitted to the second data register L2 by the first data register and an error correction operation is performed on the data P1-C0. Accordingly, the error-corrected data P1-C0 can be output right after data P0-C1 is completely output. Therefore, there is no data output gap on page boundaries, and high-speed data reading can be realized.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A non-volatile semiconductor memory device, comprising:
a memory array, comprising a plurality of memory cells;
a selecting device, selecting a page of the memory array according to address information;
a data storage device, storing data in the page selected by the selecting device; and an output device, outputting data stored in the data storage device, wherein the data storage device comprises:

a first data storage device, receiving data from the page of the memory array;

a second data storage device, receiving data transmitted by the first data storage device; and a data transmission device, configured between the first data storage device and the second data storage device, wherein during a period when the output device outputs data in a first part of the second data storage device, the data transmission device transmits data in a second part of the first data storage device to the second data storage device, and during a period when the output device outputs data in a second part of the second data storage device, the data transmission device transmits data in a first part of the first data storage device to the second data storage device.

2. The memory device as claimed in claim 1, further comprises:

an error correction device, performing error correction on data, wherein during a period when data in the first part of the second data storage device is output, the error correction device performs error correction on data in the second part of the second data storage device, and during a period when data in the second part of the second data storage device is output, the error correction device performs error correction on data in the first part of the second data storage device.

3. The memory device as claimed in claim 1, wherein the data transmission device comprises:

a plurality of transmission transistors, transmitting data stored in the first data storage device to the second data storage device, wherein selected ones of the plurality of transmission transistors are turned on in response to outputting data in the first part or the second part of the second data storage device by the output device.

4. The memory device as claimed in claim 3, wherein the output device further comprises a column address counter, when a counting value of the column address counter reaches a column address of a boundary of the first part or the second part, the selected ones of the plurality of transmission transistors are turned on.

5. The memory device as claimed in claim 3, wherein the first data storage device comprises a plurality of first latch circuits, each of which corresponds to one of a plurality of bit lines, the second data storage device comprises a plurality of second latch circuits, each of which corresponds to one of the plurality of bit lines, and each of the plurality of first latch circuits of the first data storage device is connected to a corresponding one of the plurality of second latch circuits of the second data storage device through two transmission transistors.

6. The memory device as claimed in claim 1, wherein storage capacity of the first data storage device and storage capacity of the second data storage device are equal to one page of the memory array, and the data transmission device transmits data stored in the first data storage device in a unit of 1/2 page.

7. The memory device as claimed in claim 1, wherein when performing continuous page reading, the output device serially outputs data stored in the second data storage device in a way that there is no discontinuousness at page boundaries.

8. A data reading method, applied to a non-volatile semiconductor memory device, wherein the non-volatile semiconductor memory device comprises:

a memory array, comprising a plurality of memory cells;

a page buffer, storing data transmitted from a selected page of the memory array according to address information; and an output device, serially outputting data stored in the page buffer, wherein the page buffer comprises:

a first data register, receiving data from the page of the memory array;

a second data register, receiving data transmitted from the first data register; and a transmission gate, configured between the first data register and the second data register, wherein the data reading method comprises:

during a period when outputting data in a first part of the second data register, transmitting data in a second part of the first data register to the second data register by the transmission gate; and during a period when outputting data in a second part of the second data register, transmitting data in a first part of the first data register to the second data register by the transmission gate.

9. The data reading method as claimed in claim 8, further comprising:

during a period when outputting data in the first part of the second data register, performing error correction on data in the second part of the second data register; and during a period when outputting data in the second part of the second data register, performing error correction on data in the first part of the second data register.

10. The data reading method as claimed in claim 8, further comprising:

starting continuous page reading according to input address information and a reading command; and continuously outputting data from the second data register in a way that there is no discontinuousness at page boundaries.

* * * * *